(12) United States Patent
Kenington et al.

(10) Patent No.: US 8,467,474 B2
(45) Date of Patent: Jun. 18, 2013

(54) MONITOR FOR SPECTRAL DEGRADATION OF TRANSMITTER OR RECEIVER

(75) Inventors: Peter Kenington, Chepstow (GB); Eric Westberg, Ulm (DE)

(73) Assignee: Ubidyne Inc., Wilmington, DE (US)

( * ) Notice: Subject to any disclaimer, the term of this patent is extended or adjusted under 35 U.S.C. 154(b) by 896 days.

(21) Appl. No.: 12/551,961

(22) Filed: Sep. 1, 2009

(65) Prior Publication Data

US 2011/0051785 A1    Mar. 3, 2011

(51) Int. Cl.
| | |
|---|---|
| *H04K 1/02* | (2006.01) |
| *H04L 25/03* | (2006.01) |
| *H04L 25/49* | (2006.01) |

(52) U.S. Cl.
USPC .......................................................... 375/297

(58) Field of Classification Search
USPC .......................................................... 375/297
See application file for complete search history.

(56) References Cited

U.S. PATENT DOCUMENTS

| | | |
|---|---|---|
| 6,501,735 B1 | 12/2002 | Han |
| 7,827,446 B2 | 11/2010 | Kimura et al. |
| 2006/0158225 A1 * | 7/2006 | Stojanovic et al. ............. 326/87 |
| 2007/0153884 A1 * | 7/2007 | Balasubramanian et al. 375/221 |
| 2010/0073051 A1 * | 3/2010 | Rao et al. ...................... 327/157 |

FOREIGN PATENT DOCUMENTS

| | | |
|---|---|---|
| CA | 2571385 | 6/2008 |
| JP | 2003057273 | 2/2003 |

* cited by examiner

*Primary Examiner* — Sam K Ahn
*Assistant Examiner* — Tanmay Shah
(74) *Attorney, Agent, or Firm* — 24IP Law Group

(57) ABSTRACT

A monitor for a transmitter, receiver, or transceiver is proposed. The transmitter, receiver or transceiver has at least one component with at least one varying setting parameter controlled by a parameter controller to adjust a spectral degradation of a signal processed by the transmitter, receiver, or transceiver. The monitor comprises an input for receiving the at least one varying setting parameter from the parameter controller, and a setting parameter analyzer for evaluating the at least one varying setting parameter to determine whether the at least one component is normally operating within a desired operating range and to issue a warning signal in case the at least one component is abnormally operating within the desired operating range. The varying setting parameter may be, for example, predistortion parameters or tuning parameters of a voltage controlled oscillator. A corresponding method for monitoring a transmitter, receiver or transceiver is also proposed. Furthermore, a computer program product comprising instructions for the manufacture of the monitor and a computer program product that enable a processor to carry out the monitoring method are proposed.

27 Claims, 3 Drawing Sheets

TO FAILURE MANAGEMENT SYSTEM

US 8,467,474 B2

MONITOR FOR SPECTRAL DEGRADATION OF TRANSMITTER OR RECEIVER

CROSS REFERENCE TO OTHER APPLICATIONS

The present application is related to U.S. patent application Ser. No. 12/551,947, filed Sep. 1, 2009. The entire disclosure of the foregoing application is incorporated herein by reference.

FIELD OF THE INVENTION

The field of the present invention relates to a monitor for a transmission path, for example a transmission path used in a base transceiver station of a mobile communications network. The field of the present invention further relates to a method for monitoring a transmission path. The field of the present invention also relates to a computer program product enabling a foundry to carry out the manufacture of the monitor for a transmission path, and to a computer program product enabling a processor to carry out the method for relaying packetized radio signals.

BACKGROUND OF THE INVENTION

In a base-station installation, it is desirable to be able to predict failures before the failures occur since this allows replacements and/or repairs to be carried out at scheduled maintenance visits. In the case of an antenna-embedded radio station, replacements and/or repairs may be conveniently carried out at times when the site is down (for example because another sharer of the site needs to undertake an antenna swap). The ability to control when maintenance is performed results in better reliability and lower cost of ownership.

In a base transceiver station or base-station, a transmission path typically comprises a modulator, a filter, an amplifier, and an antenna. Depending on the intended purpose of the transmission path, the amplifier needs to have a certain power rating so that the signal transmitted from the transmit path attains a desired range. In general the last amplifier in a transmission chain is termed a "power amplifier". The last amplifier typically requires most attention to power efficiency. Efficiency considerations may cause the transmission path designer to choose a power amplifier that has certain drawbacks in some of the other properties of the power amplifier. Most of the time, a compromise between power efficiency and linearity of the power amplifier needs to be made. Thus, the power amplifiers may not be optimally configured with respect to linearity.

If the type and the characteristics of the non-linearity of the power amplifier are known, it is possible to process an input signal to the power amplifier in a manner compensating for the non-linear behaviour of the power amplifier. This technique is known as "predistortion". A predistortion unit effectively models an inverse of the power amplifier's behaviour in order to achieve the desired compensation.

The predistortion can be achieved in a number of ways, including using analogue components or circuits. Digital predistortion (DPD) is nowadays often used if the signal to be amplified is available in a digital format.

The components of the transmission path are often subject to aging conditions and deterioration, as well as fluctuating environmental conditions, such as temperature and humidity. Digital components may be able to cope with effects of ageing in a satisfactory manner because of sufficiently large operating range margins facilitating reliable operation of the digital components. This is not always true for analogue components. The power amplifier in the transmission path exhibits an analogue behaviour, at least in part. Therefore, the operation of the power amplifier may change due to the aging and/or the fluctuating environmental conditions. If the power amplifier is preceded by the predistortion unit, the predistortion unit needs to reflect the changes in the power amplifier's behaviour in order to correctly compensate for these changes.

Another effect of the aging is that the components in the transmission path may begin to malfunction or fail after a certain period of time. The power amplifier is prone to suffer the ageing because it is often operated close to the limits of its specification, further adding to the stress to which the power amplifier is exposed.

The Japanese patent application JP2003-057273-A discloses a method for predicting an operation failure of a power amplifier. A distorted signal is extracted and converted into an IMD (intermodulation distortion) value to indicate the degree of distortion of a RF (radio frequency) signal from the power amplifier. The IMD value is monitored to check the degree of operation failure conditions of the power amplifier. The entire disclosure of JP2003-057273-A is incorporated herein by reference.

SUMMARY OF THE INVENTION

It would be desirable to be able to ascertain the health of a transmitter, receiver, or transceiver. To address this and possibly other concerns a monitor for a transmitter, receiver, or transceiver having at least one component with at least one varying setting parameter is proposed. The varying setting parameter is controlled by a parameter controller to adjust a spectral degradation of a signal processed by the transmitter, receiver, or transceiver. The monitor comprises an input and a setting parameter analyzer. The input is adapted to receive the at least one varying setting parameter from the parameter controller. The setting parameter analyzer is adapted to evaluate the setting parameter to determine whether the at least one component is normally operating within a desired operating range and to issue a warning signal in case the at least one component is abnormally operating within the desired operating range. An interface may be provided that is adapted to output the warning signal.

In a transmitter, receiver or transceiver spectral degradation may occur for example due to non-linearities or other phenomena. The term "spectral degradation" comprises all types of undesired deformations of the spectrum of a signal, for example intermodulation distortions or phase noise. In a transmitter, receiver or transceiver the aim is usually to maintain the spectral degradation at a level that is at least acceptable or within an applicable specification or standard.

The component is "normally operating" within the desired operating range when the behaviour of the setting parameter does not (detectably) indicate an arising future problem in connection with the component. The component is "abnormally operating" within the desired operating range when the behaviour of the setting parameter (detectably) indicates an arising future problem in connection with the component. A detection of an abnormal operation may be based on different criteria, such as the detection of a persistent drift or of an oscillation in the setting parameter.

In at least one of several possible embodiments a monitor for a transmission path having a power amplifier, an adaptive predistortion, and a predistortion controller is proposed. The monitor comprises an input for receiving a predistortion parameter exchanged between the predistortion controller and the adaptive predistortion. The setting parameter analyzer is a predistortion parameter analyzer for evaluating the predistortion parameter to determine whether the transmission path is normally operating within a desired operating range and to issue a warning signal in case the transmission path is abnormally operating within the desired operating range; and an interface for outputting the warning signal.

By using the characteristics of the adaptive predistortion itself to ascertain the health of the transmission path it is possible to provide an indicator which indicates the health of the transmission path, rather than a measure of overall IMD level at the output of the system. The monitor exploits the fact that the predistortion controller performs a detailed analysis of the non-linear behaviour of the power amplifier. The result of this analysis is reflected in at least one predistortion parameter that is sent from the predistortion controller to the adaptive predistortion. As long as the power amplifier operates in the desired manner, the predistortion parameter will not vary very much. The monitor may assume that the power amplifier operates in the desired manner and is likely to continue to do so for quite some time, if the predistortion parameter is within a range that indicates normal operation of the power amplifier, and the predistortion parameter does not vary much. If, on the other hand, the predistortion parameter, although being within the desire operating range, shows an unusual or unexpected behaviour, such as a constant drift towards one of the limits of the operating range, then the predistortion parameter analyzer is capable of detecting this situation. The predistortion parameter analyzer may then issue the warning signal. Normal operation of the transmission path is typically assumed if the predistortion parameter does not indicate a high probability for failure of the transmission path. Abnormal operation of the transmission path is assumed if the predistortion parameter indicates that the transmission path is drifting towards a failure condition with a certain probability. The certain probability may be chosen arbitrarily. It may be of interest to select the certain probability such that a substantial drift of the parameters is being detected while at the same time normal fluctuations are not tagged as being critical.

The term "predistortion parameter" as used in the claims and in the description may also comprise the plural, such as "predistortion parameters" or "at least one predistortion parameter".

The interface for outputting the warning signal may be any type of interface, such as but not limited to, a lamp, a LED, a display, a meter instrument, a loudspeaker or an interface to a failure management system of the base-station, for example Ethernet, RS232, OBSAI, CPRI etc.

It would be desirable to be able to analyze a trend in the change of the setting parameter and to use the trend as a mechanism for predicting failure (e.g. if there is an inexorable long-term drift of a particular setting parameter or series of setting parameters in a particular direction). In one embodiment this concern is addressed by the setting parameter analyzer comprising a memory for storing previous sample values of the setting parameter and a trend analyzer for using the previous sample values of the setting parameter and a value of a current sample of the setting parameter to ascertain whether the setting parameter is acquiring a trend, for example a trend that indicates that the setting parameter will probably leave the desired operating range in the future. A trend is a certain pattern observable by considering the history of the values of the samples of the setting parameter.

It would be desirable for the warning signal to be issued sufficiently early so that there is enough time to organize and carry out a maintenance operation before an affected component fails completely. The warning signal might buy the operator of the base-station enough time to include a required maintenance operation in a scheduled visit to the base-station. This would economize on labour and travel expenses. In an embodiment of the monitor this concern is addressed by the setting parameter analyzer further comprising a threshold comparator for comparing the current sample value of the setting parameter with a pre-determined threshold and to issue the warning signal if the current sample value of the setting parameter is at or beyond the threshold and analyze if the previous sample value of the setting parameter indicates a critical trend. The setting parameter analyser may combine two or more conditions that need to be fulfilled in order to issue the warning signal. The two or more conditions may form an AND relation.

The trend may be a monotonic trend or a near-monotonic trend. The monotonic trend constantly evolves in one direction from one sample to the next, for example the samples only increase in value. The near-monotonic trend is similar to a monotonic trend, but the samples are allowed to stay at a constant value for several samples or briefly drift in the opposite direction, whilst still maintaining an overall, discernable, trend. This latter behaviour could be detected in a number of ways, for example by using a moving average function on the sample data. The aging effects tend to show a gradual variation in the behaviour of the components in the transmission path. When the monotonic trend or the near-monotonic trend can be observed, this may be used as a distinction from random variations or temperature-related variations of the components' behaviour. Such variations would display a long-term average deviation from the nominal parameter value which is close to (or equal to) zero.

The predistortion parameter may be a gain-related coefficient of a digital predistortion or a non-linearity correction-related coefficient. In digital predistortion (DPD) the behaviour of the transmission path (or the inverse thereof) can be modelled by fitting a polynomial to the actual behaviour which may have been measured or determined in another manner.

The predistortion parameter analyzer may evaluate a combination of several predistortion parameters. In the case of IMD related problems, which would indicate, for example, that the specified (and mandated) levels of adjacent-channel protection (ACP) are likely to be breached, a combination of distortion coefficients may be analyzed. Then a trend may be established in overall IMD behaviour. The analysis of the combination of the several distortion coefficients may give a more complete picture about how the transmission path is varying over time.

The predistortion parameter analyzer may be adapted, programmed, or designed for taking a copy of a polynomial model of the adapted predistortion, for applying the polynomial to a representative waveform, and for analyzing the results.

The predistortion parameter analyzer may be adapted, programmed, or designed for taking an inverse of a polynomial model of the adapted predistortion, for applying the inverse of the polynomial model to a representative waveform, and for analyzing the results.

The application of the polynomial model to the representative waveform and analyzing the results may be performed off-line. The results of the application and the analyzing may be stored as a look-up table to be interrogated during the operation to determine if the combinations of the coefficients come close to representing a failure in the transmission path.

The setting parameter analyzer may be further adapted to evaluate at least one ambient parameter of the at least one component, to determine whether the at least one ambient parameter is within a specification of the at least one component, and to override the warning signal if the at least one ambient parameter is outside of the specification. The ambient parameter may be, for example, a temperature or a humidity within the transmitter, receiver, or transceiver. Electronic and electrical components are designed to operate under certain environmental conditions in accordance with the specification of the component. An operation of the component outside of the conditions defined by the specification is likely to cause unsatisfactory or unpredictable behaviour of the component. However, the component itself may be still intact. In order to prevent a false alarm that would indicate a problem with the component, the warning may be overridden. The override of the warning informs a destination of the warning (e.g. the failure management system of the base-station) that the warning indicates an inherited problem, only. The failure management system of the base-station may then prioritize a problem associated with the measured ambient parameter higher. Resolving the problem associated with the measured ambient parameter may resolve any inherited problems automatically.

The teachings disclosed herein also relate to a monitor for use with a transmission path. The transmission path has a clock, a clock distribution, a voltage controlled oscillator (VCO), and a VCO tuner. The input is adapted to receive at least one varying tuning coefficient exchanged between the VCO tuner and the voltage controlled oscillator. The setting parameter analyzer is a tuning coefficient analyzer to evaluate the tuning coefficient to determine whether the clock and/or the clock distribution is normally operating within a desired operating range and to issue a warning signal in case the clock and/or the clock distribution is abnormally operating within the desired operating range.

The monitor for VCO tuning coefficients may further show one or several of the following features:
- the operating parameter analyzer may comprise a memory for storing previous samples of the operating parameter;
- the operating parameter analyzer may comprise a trend analyzer for using the previous samples of the operating parameter and a current sample of the operating parameter to ascertain whether the operating parameter is acquiring a trend;
- the operating parameter analyzer may further comprise a threshold comparator for comparing the current sample of the operating parameter with a predetermined threshold, and to issue the warning signal if the current sample of the operating parameter is at or beyond the threshold and an analysis of the previous samples of the operating parameter indicates a critical trend;
- the trend may be monotonic or near-monotonic;
- the operating parameter analyzer may be adapted for evaluating a combination of several operating parameters;
- the operating parameter analyzer may be adapted for taking a copy of a polynomial model of a behaviour of the at least one varying operating parameter, for subjecting it to a representative waveform, and for analyzing the results;
- the operating parameter analyzer may be adapted for taking an inverse of a polynomial model of a behaviour of the at least one varying operating parameter, for subjecting it to a representative waveform, and for analyzing the results;
- subjecting the polynomial waveform to the representative waveform and analyzing the results may be performed off-line and the results may be stored as a look-up table to be interrogated during operation to determine of the combination of coefficients present come close to representing a failure.

The present disclosure further provides a method for monitoring a transmitter, receiver, or transceiver. It would be desirable that the method provides a prediction of the time and a probability of a failure of the transmitter, receiver, or transceiver. This concern and/or possibly other concerns are addressed by a method for monitoring a transmitter having at least one component with at least one varying setting parameter. The at least one varying setting parameter serves to adjust a spectral degradation of a signal processed by the transmitter, receiver, or transceiver. The method comprises receiving a setting parameter from the parameter controller; evaluating the setting parameter to determine whether the at least one component is normally operating within a desired operating range; and issuing a warning signal in case the at least one component is abnormally operating within the desired operating range.

In at least one of several possibly embodiments the method may be used for monitoring a transmission path having a power amplifier, an adaptive predistortion, and a predistortion controller. In this case the at least one component is an adaptive predistortion, the setting controller is a predistortion controller, and the setting parameter is a predistortion parameter exchanged between the predistortion controller and the adaptive predistortion.

The method may further comprise storing previous samples of the setting parameter and using the previous samples of the setting parameter and a current sample of the setting parameter to ascertain whether the setting parameter is acquiring a trend.

The method may further comprise comparing the current sample of the setting parameter with a predetermined threshold, and issuing the warning signal if the current sample of the setting parameter is at or beyond the threshold and an analysis of the previous samples of the setting parameter indicates a critical trend.

The trend may be a monotonic trend or a near-monotonic trend.

The predistortion parameter may be a gain-related coefficient of the digital predistortion or the predistortion parameter may be a non-linearity correction-related coefficient. Several ones of the setting parameters may be evaluated concurrently. The predistortion parameters may also be based upon an in-phase and quadrature (I/Q or Cartesian) model of the amplifier or a polar model, i.e. amplitude and phase.

The method may further comprise an evaluation of a copy of several ones of the predistortion parameters by the predistortion parameter analyzer.

The method may further comprise taking a copy of a polynomial model of the adaptive predistortion, applying the copy to a representative waveform, and analyzing the results.

The method may further comprise taking an inverse of a polynomial model of the adaptive predistortion, applying the inverse to a representative waveform, and analyzing the results.

The application of the polynomial model to the representative waveform and analyzing the results may be performed off-line and the results may be stored as a look-up table to be interrogated during the operation to determine if the combination of the coefficients present comes close to representing a failure.

The present disclosure also relates to a method for monitoring a transmission path having a clock and a clock distribution. The at least one component is a voltage controlled oscillator (VCO), the setting controller is a VCO tuner and the setting parameter is a tuning coefficient exchanged between the VCO tuner and the voltage controlled oscillator The method for monitoring a transmitter, receiver, or transceiver may further show one or several of the following features:

storing previous samples of the VCO tuning coefficients;

using the previous samples of the VCO tuning coefficients and a current sample of the VCO tuning coefficients to ascertain whether the VCO tuning coefficient is acquiring a trend;

comparing the current sample of the VCO tuning coefficient with a predetermined threshold;

issuing the warning signal if the current sample of the VCO tuning coefficient is at or beyond the threshold and an analysis of the previous samples of the VCO tuning coefficient indicates a critical trend;

the trend may be monotonic or near-monotonic;

evaluating a combination of several operating parameters, taking a copy of a polynomial model of a behaviour of the at least one varying VCO tuning coefficients, for subjecting it to a representative waveform, and for analyzing the results;

taking an inverse of a polynomial model of a behaviour of the at least one VCO tuning coefficients, for subjecting it to a representative waveform, and for analyzing the results;

applying the polynomial waveform to a representative waveform and analyzing the results may be performed off-line and the results may be stored as a look-up table to be interrogated during operation to determine of the combination of coefficients present come close to representing a failure.

The present disclosure further provides a computer-program product embodied on a computer-readable medium and a computer-readable medium comprising executable instructions for the manufacture of the monitor as described herein.

The present disclosure also provides a computer-program product comprising instructions that enable a processor to carry out the method as described herein.

As far as technically meaningful, the technical features disclosed herein may be combined in any manner. The monitor for a transmission path and the method for monitoring may be implemented in software, in hardware, or as a combination of both software and hardware.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will also be understood, that features of one aspect can be combined with a feature of a different aspect or aspects.

Figure 1:
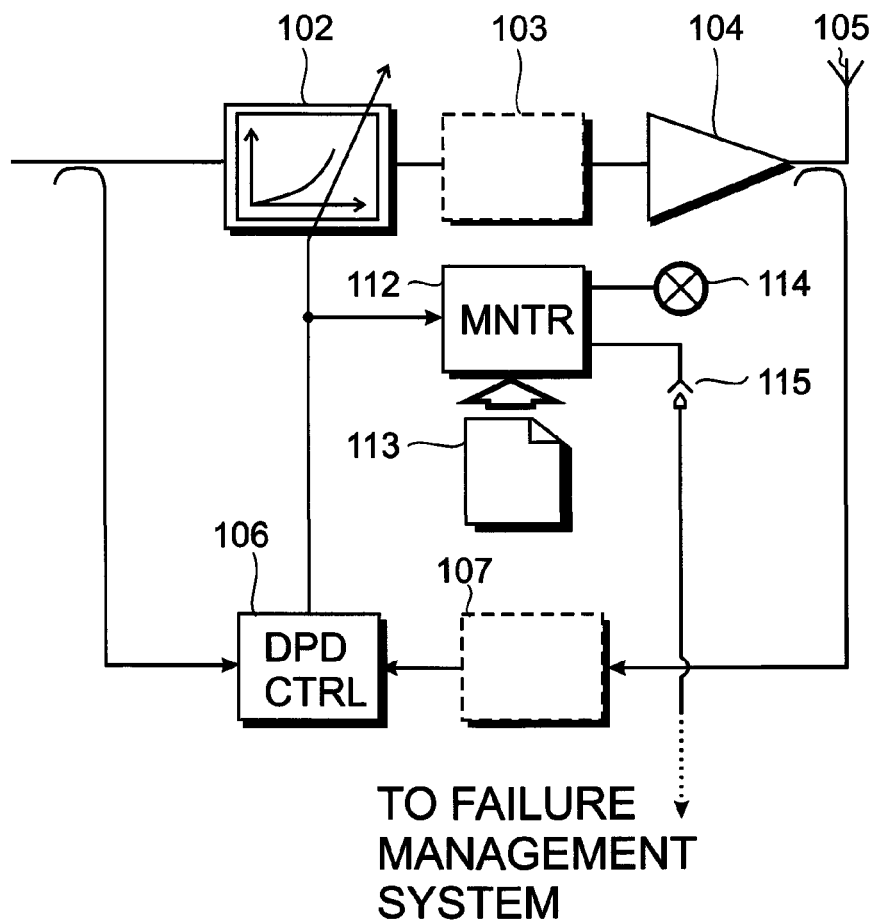
FIG. 1 shows a transmission path including a monitor as described herein.

FIG. 1 shows a transmission path that may be used in a base-station of a mobile communications network. A signal to be transmitted arrives from the left of the drawing and enters an adaptive predistortion 102. The adaptive predistortion 102 generates a predistorted signal that is passed on to a signal processing block 103. The adaptive predistortion 102 is a component that is subject to varying setting parameters, such as the coefficients of a predistortion polynomial. The purpose of the signal processing block 103 is to modify the predistorted signal so that the predistorted signal may be later transmitted over the medium for which the transmission path is designed. For example, the signal processing block 103 may comprise an up-sampler, a digital-to-analogue converter, a delta-sigma-modulator, or a quadrature modulator. Furthermore, the order of the adaptive predistortion 102 and the signal processing block 103 may be swapped, or the adaptive predistortion 102 may be situated in between two components internal to the signal processing block 103. The output of the signal processing block 103 is connected to an input of an amplifier 104 which assumes the role of a power amplifier in the illustrated transmission path, because amplifier 104 is the last amplification stage of the transmission path. It is, however, not necessary that the amplifier 104 is a power amplifier. The amplifier 104 may be operated according to any one of the following amplification modes: A, AB, B, C, D, E, F, or another amplification mode. The output of the amplifier 104 is connected to an antenna 105 for transmitting the signal in a wireless manner. Instead of the antenna 105, the transmission path may comprise an interface other than an interface to air or vacuum, such as a diode for driving an optical fibre, or a loudspeaker for transmitting an acoustic signal.

The amplifier 104 typically shows some degree of non-linear behaviour. The adaptive predistortion 102 is intended to compensate for this non-linear behaviour. Often the non-linear behaviour of the amplifier 104 varies over time, so that a fixed predistortion would not be able to compensate for the non-linear behaviour of the amplifier 104 under variable conditions. The adaptive predistortion 102 is capable of adjusting its compensation characteristics to the varying behaviour of the amplifier 104. This adjustment of compensation may be achieved by sampling the signal at the input of the adaptive predistortion 102 and also sampling the signal at the output of the power amplifier 104. Ideally, the signal sampled at the input and the signal sampled at the output should perfectly match each other. In the case of non-matching ones of the signals, the adaptive predistortion 102 does not exactly model the inverse of the transmission characteristic of the signal processing block 103 and the amplifier 104. In the transmission path illustrated in FIG. 1, the predistortion is an adaptive predistortion 102. An adaption of the adaptive predistortion 102 is performed by a setting controller which in the present case is a digital predistortion controller 106 (DPD CTRL). The digital predistortion controller 106 receives the original signal, i.e. the signal at the input of the predistortion, and an antenna signal, i.e. the signal at the output of the amplifier 104. By comparing the input signal with the antenna signal the predistortion controller 106 is capable of determining how the model of the adaptive predistortion 102 differs from the actual behaviour of the amplifier 104. The predistortion controller 106 may calculate improved setting parameters for the predistortion model that is used by the adaptive predistortion 102 based on the basis of the difference between the input signal and the antenna signal. The predistortion controller 106 sends the updated, improved predistortion parameter to the adaptive predistortion 102.

The transmission path illustrated in FIG. 1 comprises the signal processing block 103 between the adaptive predistortion 102 and the amplifier 104. Therefore the antenna signal sampled at the output of the amplifier 104 has undergone some degree of signal processing, such as modulation and/or digital-to-analogue conversion. In order for the predistortion controller 106 to perform a meaningful comparison between the original signal and the antenna signal, at least some of the signal processing undergone by some processes in the signal processing block 103 needs to be reversed. The reversing is achieved by the reversing block 107.

The operation of the predistortion controller 106 will normally converge to a normal (or stable) working operation after a short period of time. This means that the predistortion parameters generated by the predistortion controller 106 do not change in value, or only in a marginal manner, as long as the behaviour of the amplifier 104 does not vary in its behaviour. The amplifier 104 may however, exhibit some variations in behaviour due to temperature variations and/or aging. The variations may cause the predistortion controller 106 to issue updated values for the predistortion parameters. A monitor 112 observes the communication between the predistortion controller 106 and the adaptive predistortion 102. The monitor 112 receives a copy of the predistortion parameter or simply taps the line over which the predistortion parameter is being sent. The monitor 112 analyzes the predistortion parameter, for example by checking it against predefined upper and/or lower limits. The monitor 112 might also recreate the predistortion model used by the adaptive predistortion 102, or compare the recreated model with predefined predistortion model patterns that are indicative for different states of operation of the amplifier or of the entire transmission path. Different states of operation could be normal operation, overheat, and operation under significant aging effects of the amplifier 104. The information about the upper and/or lower limits and predistortion model patterns may be submitted to the monitor 112 using a set of rules 113, which may be implemented as a data file. The monitor 112 is capable of outputting a warning signal on the basis of these checks and comparisons. The warning signal may be a lamp 114 or an interface 115 which connects the monitor 112 directly to a failure management system of the base-station. In case the monitor 112 issues a warning signal, the failure management system of the base-station may collect any relevant information about the particular failure event and send a failure report to a central office of the mobile network operator. At the central office it will then be decided how this failure shall be dealt with.

The teachings disclosed herein can be illustrated by considering a polynomial form of digital predistortion (although it is equally applicable to other forms, for example, the use of a look-up table). A polynomial predistortion attempts to counteract the non-linear characteristics of the amplifier 104 and (to a limited degree) changes in linear gain by inserting a polynomial function prior to the power amplifier. This is usually performed utilizing a digital realization of a polynomial function in which the polynomial coefficients: a, b, c, d, . . . etc. are updated in response to changes in the amplifier characteristics and input/output powers in accordance with the following equation:

$$I_{out} = aI_{in} - bI_{in}^3 + cI_{in}^5 - dI_{in}^7$$

Separate polynomials are typically provided for the in-phase (I) and quadrature (Q) channels and are sometimes also provided for amplifier memory correction (again in I and Q channels). This leads to up to four sets of polynomial coefficients being required in order to describe the characteristics of a typical amplifier (sometimes more, for a more sophisticated modelling of the power amplifier).

The monitoring of the trends in these various coefficients and a recognition of a trend in one or more of these various coefficients can be interpreted as an early sign that a particular amplifier (or complete transmitter) may be heading toward a potential failure event. The particular amplifier (or the complete transmitter) may be heading toward the potential failure event, whilst still within its operation and specification parameters. For example, if the linear gain coefficient (a in the above equation) acquires a monotonic or near monotonic trend toward a lower value, this trend indicates that the power amplifier gain (or that of one or more other forward-path components) is increasing. In turn, an increase of the power amplifier gain could be an indication that the power amplifier is heading for an abnormal level of gain, suffering from an (undetected) heat-related issue or some other fault. Once a given (pre-determined) threshold level is reached and an analysis of (stored) recent coefficients indicates that this increase of power amplifier gain is a part of a trend and not a short-term issue, then a warning could be issued to indicate that a failure event is likely in the near future. The lower the threshold level, the more of the forewarning provided (but the greater the likelihood of a false alarm). The trend in the power amplifier gain should be analyzed over days, weeks or months, rather than seconds or minutes, in order to be representative and prevent false alarms. False alarms can also be avoided by combining the coefficient/trend information discussed here with other information from the unit (e.g. outside temperature). If, for example, the gain falls outside of what would normally be thought of as an acceptable range, but the outside temperature is unusually high or low (perhaps falling outside of the unit's designed operating range), then the gain alarm may be a false indication of a problem and could be ignored temporarily.

IMD-related problems often indicate that specified (and mandated) levels of adjacent-channel protection are likely to be breached. In such a situation, a combination of the coefficients b, c, d, . . . etc. need to be analyzed and a trend then established in the overall IMD behaviour. There may be a complex interaction between the coefficients in generating a given order of distortion or level of adjacent channel power. Therefore, the combined analysis of trends in several different ones of the coefficients may reveal such complex interaction. The combined analysis could be performed, for example, by taking a copy of the polynomial model (in a digital signal processor (DSP)) and applying the copy of the polynomial model to a representative waveform (again, in the DSP) and analyzing the results. Alternatively, the combined analysis could be performed on an inverse of the polynomial model (i.e. effectively a re-creation of the power amplifier characteristic itself). As a further alternative, either process could be undertaken off-line (during the design process) for a wide range of combinations of the coefficient and the results stored as a look-up table. This look-up table could then be interrogated to determine if the combination of the coefficients present came close to representing a specification failure or unit failure.

The concept shown in FIG. 1 may be generalized as follows. In a transmitter, receiver, or transceiver several further components may exist that are subject to varying ones of the operating parameters. Examples include, but are not limited to, IC calibration parameters, power/noise measurements, clock/data phase alignment measurements and bus communication checks. An example of the application of the teachings of this disclosure is in the monitoring of the calibration coefficients of a receive channel integrated circuit (IC) in the transceiver. Depending on the implementation, the receive channel IC comprises a voltage controlled oscillator (VCO). The coefficients of the VCO relate to the quality of a receive path. If the VCO coefficients of the IC begin to drift this drift could indicate a degradation of a clock distribution of the receive path, or even an entire transceiver. If the degradation continues, it might impact both a transmit performance and a receive performance of the transceiver. Another example is the control of a noise shaping in the receive path. If the coefficients relating to the noise shaping of the receive path begin to drift the drift in the noise-shaping coefficients could indicate a degradation in the receive capability of the receiver or the transceiver causing receive sensitivity or blocker performance failures.

Figure 2:
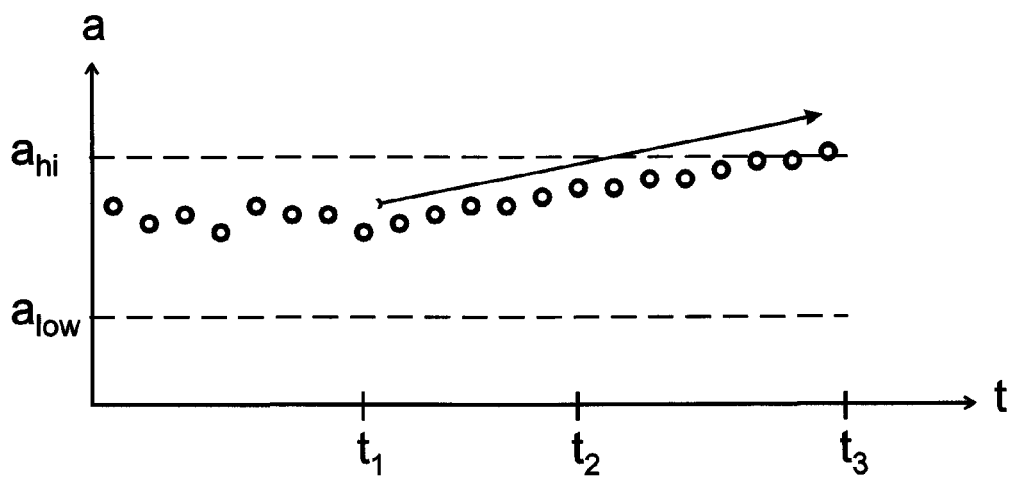
FIG. 2 shows an exemplary temporal evolution of a predistortion parameter.

FIG. 2 shows an exemplary temporal evolution of the linear gain factor a of the predistortion polynomial according to equation 1. Up to the point indicated by $t_1$, the linear gain coefficient a shows a relatively normal behaviour by fluctuating slightly around a certain value. Small variations in the linear gain coefficient may be temperature related and thus be influenced by the ambient temperature and/or the degree of incident solar radiation, for example. Approximately at the time $t_1$ the linear gain coefficient a starts to acquire a trend toward an upper limit $a_{hi}$ that has been pre-defined to represent a boundary of a region of normal operation of the power amplifier. The region of normal operation is also bounded by a lower limit $a_{low}$. At the time $t_1$, the monitor 112 may not notice that the linear gain coefficient a is acquiring a trend. However, at the time $t_2$ an increase in the coefficient a begins to appear. The increasing linear gain coefficient a of the predistortion model employed by the adapted predistortion 102 means that the linear gain of the amplifier 104 is degrading. The monitor 112 is capable of detecting the trend that is already forming between $t_1$ and $t_2$ by analyzing the past values of the linear gain coefficient a. Thus, the monitor 112 may issue a warning signal at the time $t_2$ or shortly thereafter. As can be seen in FIG. 2, the trend continues and the linear gain coefficient a continues to increase until it exceeds the upper limit $a_{hi}$. At the time $t_3$ the performance of the amplifier 104 has degraded to such an extent, that typically no normal operation is possible anymore. However, the early warning of the monitor 112 at the time $t_2$ provided the operator of the transmission path with sufficient time to repair and/or replace the failing amplifier 104. Together with the warning signal the monitor 112 may communicate information about how fast the performance of the amplifier 104 or the entire transmission path is degrading. This communicated information may be based on the slope of the trend and on extrapolation or estimation of the future evolution.

The monitor 112 may receive measurements from other sensors (such as a temperature sensor attached to the amplifier 104 or a transmission power sensor). The monitor 112 may take readings from the other sensors into account when evaluating the predistortion parameters, such as the linear gain coefficient a in FIG. 2. This additional information enables the monitor 112 to distinguish between actual aging effects on the one hand and tough operating conditions on the other hand. In the latter case, the monitor 112 may conclude that the observed behaviour of the predistortion parameter does not necessarily indicate an imminent failure of a component. Nevertheless, it is known that tough operating conditions may shorten the lifetime of electronic components considerably.

Figure 3:
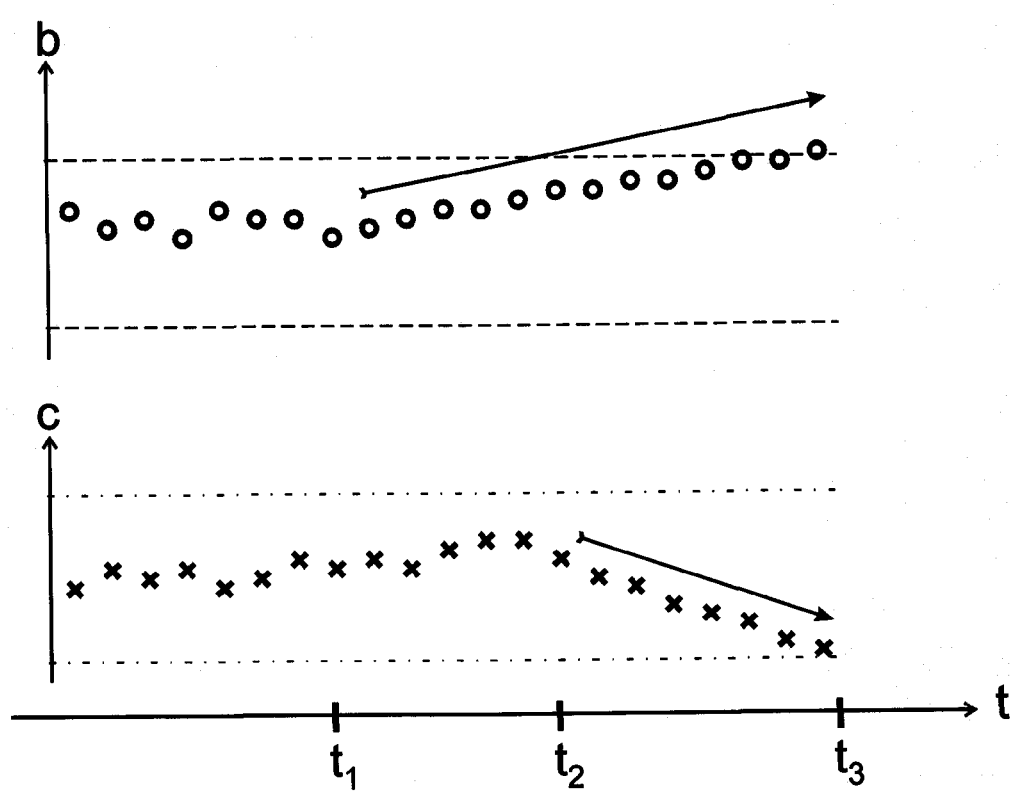
FIG. 3 shows an exemplary temporal evolution of a combination of two predistortion parameters.

FIG. 3 shows the exemplary temporal evolutions of two predistortion parameters, namely the third order coefficient b and the fifth order coefficient c. For each one of the coefficients a region of normal operation has been defined, indicated by the dashed lines for the coefficient b and the dot-dashed lines for the coefficient c. The coefficient b begins to acquire a trend approximately at the time $t_1$. It may be that a trend in the third order coefficient b is not a reliable indicator of a failure. Therefore usually no warning signal is issued as long as the third order coefficient b stays in the desired range of operation. The fifth order coefficient c shows a more or less normal behaviour up to the time $t_2$.

Starting at the time $t_2$ the fifth order coefficient c begins to acquire a decreasing trend. The combination of the increasing trend in coefficient b and the decreasing trend in coefficient c may be sufficiently reliable to indicate an imminent failure of the amplifier or another component in the transmission path. The description of this behaviour is for illustrative purposes only, and does not mean that an amplifier available in the market would actually exhibit such a behaviour. Turning back to FIG. 3, the monitor 112 may observe the decreasing trend in coefficient d for some time and then issue a warning signal at a time somewhere in between $t_2$ and $t_3$.

Figure 4:
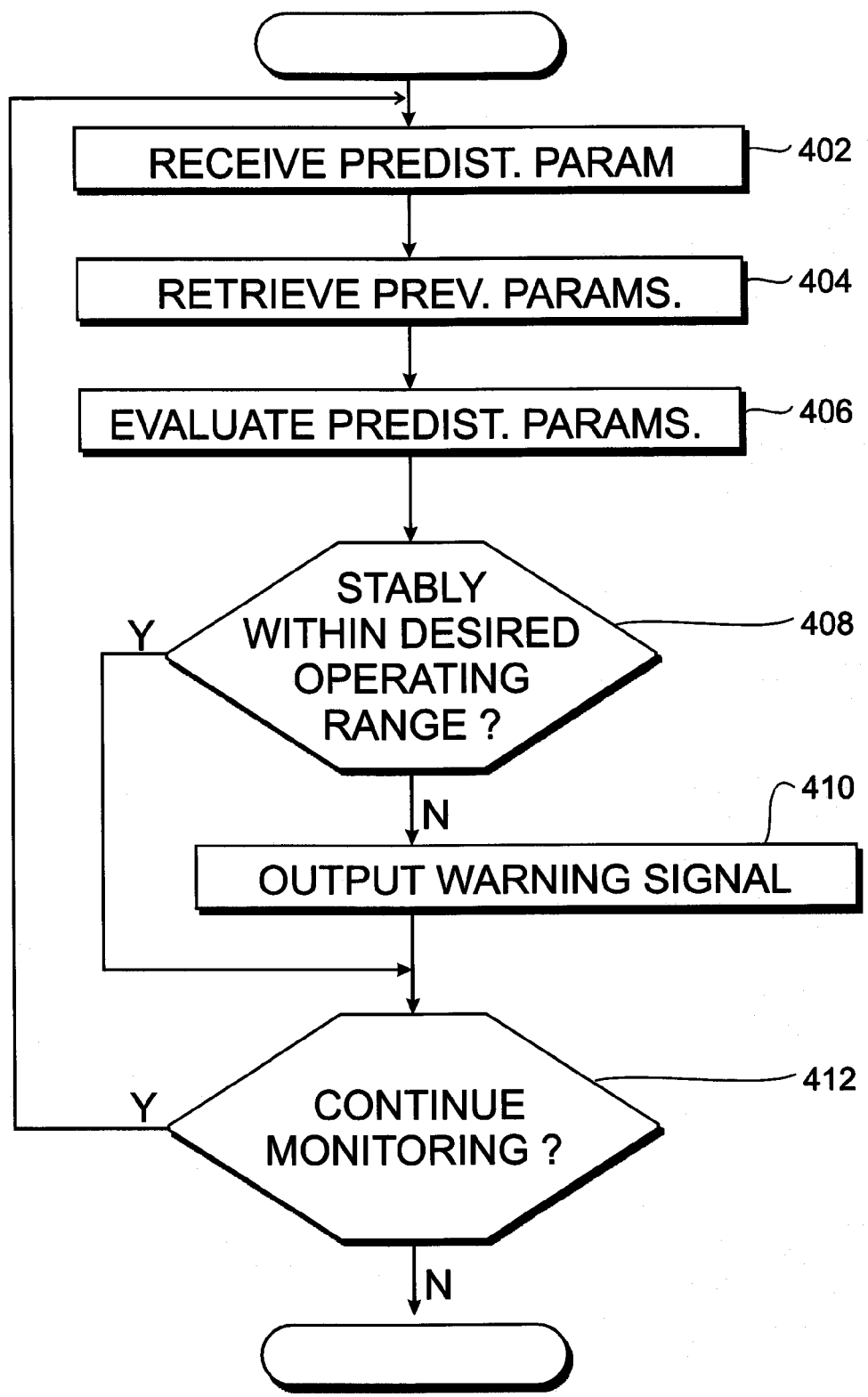
FIG. 4 shows a flowchart of a method as described herein.

FIG. 4 shows a flowchart to illustrate a method for monitoring a transmission path. The method describes the actions that may be performed by the monitor 112. After the method has started, a first action 402 is to receive a predistortion parameter or several ones of the predistortion parameters that is/are exchanged between the predistortion controller 106 and the adaptive predistortion 102. Then previous samples of the predistortion parameter(s) are retrieved in action 404. The previous samples of the predistortion parameter(s) have been stored during earlier iterations of the method. The previous samples may be stored in a dedicated memory, a memory present on a DSP, in a shift register, on a computer readable medium, or some other suitable device. Typically the storage for the previous samples is configured to store a certain maximum number of previous samples. Once the maximum number has been reached, the oldest sample will be deleted from the storage with each new iteration to make place for the latest sample, that is the current sample. The method then proceeds to evaluating the predistortion parameters in action 406. The evaluation may be performed by using the previous samples of the predistortion parameter(s) and a current sample of the predistortion parameter(s) to ascertain whether the predistortion parameter(s) is/are acquiring a trend. A purpose of the evaluation is to determine whether the transmission path is normally operating within a desired operating range (action 408). In case the transmission path is abnormally operating within the desired operating range, a warning signal should be issued at action 410. In case the transmission path is normally or abnormally operating outside of the desired operating range, a warning signal is typically issued anyway, or the transmission path is deactivated all together to prevent further damage or breach of a spectral mask as defined by various standards and specifications for base-stations of mobile communications networks. No further action needs to be taken and the method jumps to a decision point 412 regarding the continuation of the method, if it has been determined that the transmission path is normally operating within the desired operation range. The method loops back to begin the next iteration, if the method is to be continued. Typically, the method will wait a certain time before starting the next iteration as the behaviour of the amplifier and/or the transmission path varies slowly. In case the evaluation of the predistortion parameters shows that the transmission path is not normally operating within the desired operating range, the monitor 112 outputs a warning signal. After the warning signal has been issued, the method reaches the decision point 412 regarding the continuation of the method.

The monitor 112 for a transmission path, the method for monitoring a transmission path, and the corresponding computer program products are applicable to a wide range of communications equipment, including remote radio heads and in-cabinet transceivers. The monitor, the method and/or the corresponding computer program products allow potential unit failures to be detected early, giving operators a wider choice of actions. Moreover, they help preventing loss of operator revenues due to a catastrophic failure, which is likely (almost by definition) to occur at an unknown and unscheduled time during the product's life span.

While various embodiments of the present invention have been described above, it should be understood that they have been presented by way of example, and not limitation. It will be apparent to persons skilled in the relevant arts that various changes in form and detail can be made therein without departing from the scope of the invention. For example, most of the digital components described herein could be implemented as analogue components. In particular, the digital predistortion (DPD) could be an adaptive analogue predistortion. In addition to using hardware (e.g., within or coupled to a Central Processing Unit ("CPU"), micro processor, micro controller, digital signal processor, processor core, system on chip ("SOC") or any other device), implementations may also be embodied in software (e.g. computer readable code, program code, and/or instructions disposed in any form, such as source, object or machine language) disposed for example in a computer useable (e.g. readable) medium configured to store the software. Such software can enable, for example, the function, fabrication, modelling, simulation, description and/or testing of the apparatus and methods describe herein. For example, this can be accomplished through the use of general program languages (e.g., C, C++), hardware description languages (HDL) including Verilog HDL, VHDL, and so on, or other available programs. Such software can be disposed in any known computer useable medium such as semiconductor, magnetic disc, or optical disc (e.g., CD-ROM, DVD-ROM, etc.). The software can also be disposed as a computer data signal embodied in a computer useable (e.g. readable) transmission medium (e.g., carrier wave or any other medium including digital, optical, analogue-based medium). Embodiments of the present invention may include methods of providing the apparatus described herein by providing software describing the apparatus and subsequently transmitting the software as a computer data signal over a communication network including the Internet and intranets.

It is understood that the apparatus and method described herein may be included in a semiconductor intellectual property core, such as a micro processor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. A monitor for a transmitter, receiver, or transceiver having at least one component with at least one varying setting parameter controlled by a parameter controller to adjust a spectral degradation of a signal processed by the transmitter, receiver, or transceiver, the monitor comprising:

an input for receiving the at least one varying setting parameter from the parameter controller, and a setting parameter analyzer for evaluating the at least one varying setting parameter to determine whether the at least one component is normally operating within a desired operating range and to issue a warning signal in case the at least one component is abnormally operating within the desired operating range;

wherein the settings parameter analyzer comprises a memory for storing previous sample values of the setting parameter and a trend analyzer for using the stored previous sample values of the setting parameter and a current sample value of the setting parameter to ascertain whether the setting parameter is acquiring a trend;

wherein the setting parameter analyzer further comprises a threshold comparator for comparing the current sample value of the setting parameter with a predetermined threshold, and for issuing the warning signal if the current sample value of the setting parameter is at or beyond the threshold and an analysis of the previous sample values of the setting parameter indicates a critical trend.

2. The monitor according to claim 1 for use with a transmission path having a power amplifier, an adaptive predistortion, and a predistortion controller, wherein the input is adapted to receive a predistortion parameter exchanged between the predistortion controller and the adaptive predistorter;

the setting parameter analyzer is a predistortion parameter analyzer for evaluating the predistortion parameter to determine whether the transmission path is normally operating within a desired operating range and to issue a warning signal in case the transmission path is abnormally operating within the desired operating range.

3. The monitor according to claim 1, wherein the trend is a monotonic trend or a near-monotonic trend.

4. The monitor according to claim 2, wherein the predistortion parameter is a gain-related coefficient of a digital predistortion.

5. The monitor according to claim 2, wherein the predistortion parameter is a non-linearity correction-related coefficient.

6. The monitor according to claim 1, wherein the setting parameter analyzer is adapted for evaluating a combination of several setting parameters.

7. The monitor according to claim 2, wherein the predistortion parameter analyzer is adapted to take a copy of a polynomial model of the adaptive predistortion, for applying the copy of the polynomial model to a representative waveform, and for analyzing the results.

8. The monitor according to claim 2, wherein the predistortion parameter analyzer is adapted to take an inverse of a polynomial model of the adaptive predistortion, to apply the inverse of the polynomial model to a representative waveform, and to analyze the results.

9. The monitor according to claim 7, wherein the predistortion parameter analyzer is adapted to perform applying the polynomial model to the representative waveform and analyzing the results off-line, and to store the results as a look-up table to be interrogated during operation to determine if the combination of coefficients present indicate a high probability for failure.

10. The monitor according to claim 8, wherein the predistortion parameter analyzer is adapted to perform applying the polynomial model to the representative waveform and analyzing the results off-line, and to store the results as a look-up table to be interrogated during operation to determine if the combination of coefficients present indicate a high probability for representing a failure.

11. The monitor according to claim 1, wherein the setting parameter analyzer is further adapted to evaluate at least one ambient parameter of the at least one component, to determine whether the at least one ambient parameter is within a specification of the at least one component, and to override the warning signal if the at least one ambient parameter is outside of the specification.

12. The monitor according to claim 1 for use with a transmission path having a clock, a clock distribution, a voltage controlled oscillator (VCO), and a VCO tuner, wherein the input is adapted to receive at least one varying tuning coefficient exchanged between the VCO tuner and the voltage controlled oscillator, the setting parameter analyzer is a tuning coefficient analyzer for evaluating the tuning coefficient to determine whether the at least one clock and/or the clock distribution is normally operating within a desired operating range and to issue a warning signal in case the at least one clock and/or clock distribution is abnormally operating within the desired operating range.

13. Computer-program product embodied on a non-transitory computer-readable medium and the non-volatile computer-readable medium comprising executable instructions for the manufacture of a monitor for a transmitter, receiver, or transceiver having at least one component with at least one varying setting parameter controlled by a parameter controller to adjust a spectral degradation of a signal processed by the transmitter, receiver, or transceiver, the monitor comprising:
an input for receiving at least one varying setting parameter exchanged between the setting controller and the at least one component; and
a setting parameter analyzer for evaluating the at least one setting parameter to determine whether the at least one component is normally operating within a desired operating range and to issue a warning signal in case the at least one component is abnormally operating within the desired operating range,
wherein the settings parameter analyzer comprises a memory for storing previous sample values of the setting parameter and a trend analyzer for using the stored previous sample values of the setting parameter and a current sample value of the setting parameter to ascertain whether the setting parameter is acquiring a trend;
wherein the setting parameter analyzer further comprises a threshold comparator for comparing the current sample value of the setting parameter with a predetermined threshold, and for issuing the warning signal if the current sample value of the setting parameter is at or beyond the threshold and an analysis of the
previous sample values of the setting parameter indicates a critical trend.

14. A method comprising:
monitoring a transmitter, receiver, or transceiver having at least one component with at least one varying setting parameter to adjust a spectral degradation of a signal processed by the transmitter, receiver, or transceiver, the method comprising the steps of:
receiving by a transmitter, receiver or transceiver, a setting parameter;
evaluating the setting parameter to determine whether the at least one component is normally operating within a desired operating range; and
issuing a warning signal in case the at least one component is abnormally operating within the desired operating range,
wherein the settings parameter analyzer comprises a memory for storing previous sample values of the setting parameter and a trend analyzer for using the stored previous sample values of the setting parameter and a current sample value of the setting parameter to ascertain whether the setting parameter is acquiring a trend;
wherein the setting parameter analyzer further comprises a threshold comparator for comparing the current sample value of the setting parameter with a predetermined threshold, and for issuing the warning signal if the current sample value of the setting parameter is at or beyond the threshold and an analysis of the previous sample values of the setting parameter indicates a critical trend.

15. The method according to claim 14 for monitoring a transmission path having a power amplifier, wherein
the at least one component is an adaptive predistortion;
the setting controller is a predistortion controller; and
the setting parameter is a predistortion parameter exchanged between the predistortion controller and the adaptive predistortion.

16. The method according to claim 14, further comprising storing previous sample values of the setting parameter and using the stored previous sample values of the setting parameter and a current sample value of the setting parameter to ascertain whether the setting parameter is acquiring a trend.

17. The method according to claim 16, further comprising comparing the current sample value of the setting parameter with a predetermined threshold,
issuing the warning signal if the current sample value of the setting parameter is at or beyond the threshold and an analysis of the previous sample values of the setting parameter indicates a critical trend.

18. The method according to claim 16, wherein the trend is a monotonic trend or a near-monotonic trend.

19. The method according to claim 15, wherein the predistortion parameter is a gain-related coefficient of a digital predistortion.

20. The method according to claim 15, wherein the predistortion parameter is a non-linearity correction-related coefficient.

21. The method according to claim 14, further comprising evaluating a combination of several setting parameters.

22. The method according to claim 21, further comprising taking a copy of a polynomial model of the adaptive predistortion,
applying the copy of the polynomial model to a representative waveform to obtain a result, and
analyzing the result.

23. The method according to claim 21, further comprising taking an inverse of a polynomial model of the adaptive predistortion, applying the inverse of the polynomial model to a representative waveform to obtain a result, and analyzing the result.

24. The method according to claim 22, wherein applying the polynomial model to a representative waveform and analyzing the results is performed off-line and storing the results for interrogation during operation to determine if the combination of coefficients present indicate a high probability for failure.

25. The method according to claim 23, wherein applying the polynomial model to a representative waveform and analyzing the results is performed off-line and storing the results for interrogation during operation to determine if the combination of coefficients present indicate a high probability for failure.

26. The method according to claim 14 for monitoring a transmission path having a clock and a clock distribution, wherein
the at least one component is a voltage controlled oscillator (VCO),
the setting controller is a VCO tuner, and
the setting parameter is a tuning coefficient exchanged between the VCO tuner and the voltage controlled oscillator.

27. Computer program product stored on a non-transitory medium and comprising instructions that enable a processor to carry out a method for monitoring a transmitter, receiver, or transceiver having at least one component with at least one varying setting parameter to reduce a spectral degradation of a signal processed by the transmitter, receiver, or transceiver, the method comprising:
receiving a setting parameter; and
evaluating the setting parameter to determine whether the at least one component is normally operating within a desired operating range and to issue a warning signal in case the at least one component is abnormally operating within the desired operating range.
- wherein the settings parameter analyzer comprises a memory for storing previous sample values of the setting parameter and a trend analyzer for using the stored previous sample values of the setting parameter and a current sample value of the setting parameter to ascertain whether the setting parameter is acquiring a trend;
- wherein the setting parameter analyzer further comprises a threshold comparator for comparing the current sample value of the setting parameter with a predetermined threshold, and for issuing the warning signal if the current sample value of the setting parameter is at or beyond the threshold and an analysis of the previous sample values of the setting parameter indicates a critical trend.

\* \* \* \* \*